(12) United States Patent
Hatanaka et al.

(10) Patent No.: US 8,516,690 B2
(45) Date of Patent: Aug. 27, 2013

(54) ANISOTROPIC CONDUCTIVE JOINT PACKAGE

(75) Inventors: Yusuke Hatanaka, Haibara-gun (JP); Yoshinori Hotta, Aichi (JP); Tadabumi Tomita, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 306 days.

(21) Appl. No.: 12/747,128

(22) PCT Filed: Dec. 1, 2008

(86) PCT No.: PCT/JP2008/071801
§ 371 (c)(1),
(2), (4) Date: Jun. 9, 2010

(87) PCT Pub. No.: WO2009/075198
PCT Pub. Date: Jun. 18, 2009

(65) Prior Publication Data
US 2010/0294547 A1  Nov. 25, 2010

(30) Foreign Application Priority Data

Dec. 10, 2007 (JP) ................................. 2007-318559
Apr. 30, 2008 (JP) ................................. 2008-11863

(51) Int. Cl.
*H01R 43/00* (2006.01)

(52) U.S. Cl.
USPC ....... 29/830; 428/304.4; 428/307.3; 428/209; 428/472.2; 428/901; 428/107; 428/108; 428/109; 428/119; 29/877; 257/2; 257/3; 257/4; 257/5; 439/591

(58) Field of Classification Search
USPC ............ 428/209, 304.4, 307.3, 307.7, 312.2, 428/312.8, 313.9, 316.6, 317.1, 472.2, 901; 257/2, 3, 4, 5, E27.004, E31.008, E31.029, 257/E45.002; 438/95, 96, 107–109, 119; 369/126; 174/88 R, 84 R; 439/591; 29/877; 156/285
See application file for complete search history.

(56) References Cited

U.S. PATENT DOCUMENTS 5,262,226 A * 11/1993 Yoshida ........................ 428/209
5,379,515 A    1/1995 Kondo et al.
(Continued)

FOREIGN PATENT DOCUMENTS

JP  03-182081 A   8/1991
JP  03-276512 A  12/1991
(Continued)

OTHER PUBLICATIONS

International Preliminary Report on Patentability for PCT JP2008/071801 dated Aug. 19, 2010.
(Continued)

*Primary Examiner* — David Sample
*Assistant Examiner* — Nicholas W Jordan
(74) *Attorney, Agent, or Firm* — Sughrue Mion, PLLC

(57) ABSTRACT

An anisotropic conductive joint package in which an anisotropic conductive film is joined to at least one conductive material selected from among the group consisting of gold (Au), silver (Ag), copper (Cu), aluminum (Al), magnesium (Mg), nickel (Ni), a tin oxide doped with indium (ITO), molybdenum (Mo), iron (Fe), palladium (Pd), beryllium (Be), and rhenium (Re). The package is characterized in that: the anisotropic conductive film has an insulating base and conductive paths composed of conductive members, insulated from one another, and extending through the insulating base in the direction of the thickness of the insulating base, one ends of the conductive paths are exposed from one side of the insulating base, the other ends are exposed from the other side, the density of the conductive paths is 3,000,000 pieces/$mm^2$ or more, the insulating base is a structural body composed of an anodic oxide film of an aluminum substrate having micropores, and each micropore does not have a branch structure along the depth. The package can be used as an anisotropic conductive member of an electronic component of a semiconductor device or the like or a connector for inspection even if the structure has a much higher degree of integration realized by drastically improving the installation density of the conductive paths.

6 Claims, 6 Drawing Sheets

(56) References Cited

U.S. PATENT DOCUMENTS

| | | | |
|---|---|---|---|
| 6,395,992 B1* | 5/2002 | Nakayama et al. | 174/254 |
| 6,723,213 B2* | 4/2004 | Nakadai et al. | 204/298.13 |
| 7,156,669 B2 | 1/2007 | Asai et al. | |
| 2002/0109134 A1* | 8/2002 | Iwasaki et al. | 257/13 |
| 2005/0077542 A1 | 4/2005 | Asai et al. | |
| 2007/0059503 A1* | 3/2007 | Park et al. | 428/209 |
| 2007/0105304 A1* | 5/2007 | Kasai et al. | 438/254 |
| 2008/0078982 A1* | 4/2008 | Min et al. | 257/3 |
| 2008/0284042 A1* | 11/2008 | Hotta et al. | 257/775 |

FOREIGN PATENT DOCUMENTS

| | | |
|---|---|---|
| JP | 04-087213 A | 3/1992 |
| JP | 2000-012619 A | 1/2000 |
| JP | 2002-134570 A | 5/2002 |
| JP | 2004-022682 A | 1/2004 |
| JP | 2004-285405 A | 10/2004 |
| JP | 2005-085634 A | 3/2005 |
| JP | 2005-206717 A | 8/2005 |
| JP | 2006-127956 A | 5/2006 |
| JP | 2007-053107 A | 3/2007 |
| JP | 2007-193972 A | 8/2007 |
| JP | 2007-238988 A | 9/2007 |
| JP | 2007-247015 A | 9/2007 |

OTHER PUBLICATIONS

First Office Action, dated Jul. 4, 2012, issued in corresponding CN Application No. 200880119897.2, 10 pages in English and Chinese.
Notification of Reasons for Refusal, dated Aug. 21, 2012, issued in corresponding JP Application No. 2008-118639, 10 pages in English and Japanese.

* cited by examiner

A SIDE ELECTRODE PATTERN

B SIDE ELECTRODE PATTERN

ANISOTROPIC CONDUCTIVE JOINT PACKAGE

CROSS REFERENCE TO RELATED APPLICATIONS

This application is a National Stage of International Application No. PCT/JP2008/071801 filed Dec. 1, 2008, claiming priority based on Japanese Patent Application No. 2007-318559 and JP 2008-118639, filed Dec. 10, 2007 and Apr. 30, 2008, respectively, the contents of all of which are incorporated herein by reference in their entirety.

TECHNICAL FIELD

The present invention relates to an anisotropic conductive film using a metal-filled microstructure and a method of manufacturing the same. More specifically, the present invention relates to an anisotropic conductive joint package which has an anisotropic conductive film using a metal-filled microstructure and a method of manufacturing the same.

BACKGROUND ART

An anisotropic conductive member, when inserted between an electronic component such as a semiconductor device and a circuit board, then subjected to merely the application of pressure, is able to provide an electrical connection between the electronic component and the circuit board. Accordingly, such members are highly attractive members that are widely used, for example, as connecting members for semiconductor devices and other electronic components and as inspection connectors when carrying out functional inspections, and that can be expected to be applied to optical transmission materials.

In particular, owing to the remarkable degree of miniaturization that has occurred in electronically connecting members for semiconductor devices and the like, connection stability cannot be fully guaranteed in conventional techniques such as wire bonding that involve the direct connection of a wiring substrate. This situation has drawn attention in recent years to anisotropic conductive members of a type in which an array of electrically conductive elements pass completely through a film of insulating material, or of a type in which metal balls are arranged in a film of insulating material.

Inspection connectors have been developed to avoid the large monetary losses that are incurred when, upon carrying out functional inspections after an electronic component such as a semiconductor device has been mounted on a circuit board, the electronic component is found to be defective and the circuit board is discarded together with the electronic component. By bringing electronic components such as semiconductor devices into electrical contact with a circuit board through an anisotropic conductive member at positions similar to those to be used during mounting and carrying out functional inspections, it is possible to perform the functional inspections without mounting the electronic components on the circuit board, thus enabling the above problem to be avoided.

An anisotropic conductive member used in such applications is described in Patent Document 1, which discloses "an anisotropic conductive film comprising a film substrate composed of an adhesive insulating material and a plurality of conductive paths composed of a conductive material which are arrayed within the film substrate in a mutually insulated state and pass entirely through the film substrate in a thickness direction thereof, wherein the conductive paths have shapes, in a cross-section parallel to a lengthwise direction of the film substrate, with circumferences having thereon an average maximum length between two points of from 10 to 30 μm, and wherein neighboring conductive paths have intervals therebetween which are from 0.5 to 3 times the average maximum length."

Patent Document 2 discloses "an anisotropic conductive film comprising a film base composed of an insulating resin and a plurality of conductive paths which are mutually insulated, pass entirely through the film base in a thickness direction thereof and are positioned in staggered rows, wherein conductive paths in mutually neighboring conductive path rows have a smaller distance therebetween than conductive paths within a single row of conductive paths."

Patent Documents 1 and 2 disclose methods of manufacturing such anisotropic conductive films in which fine wires of an anisotropic conductive material are inserted into an insulating film, the elements are integrally united by the application of heat and pressure, and scribing is subsequently carried out in the thickness direction.

Patent Document 3 examines a method of manufacturing an anisotropic conductive film which involves electroforming conductive columns using a resist and a mask, then pouring an insulating material in the columns and solidifying the insulating material.

Patent Document 4 discloses "a method of manufacturing an electrically connecting member having a retaining body made of an electrically insulating material and a plurality of conductive elements provided in a mutually insulating state within the retaining body, wherein an end of each conductive element is exposed on a side of the retaining body and the other end of each conductive element is exposed on the other side of the retaining body, the method comprising:
a first step of exposing a matrix having a base and an insulating layer which, when deposited on the base, forms the retaining body to a high energy beam from the insulating layer side, thereby removing all of the insulating layer and part of the base in a plurality of regions so as to form a plurality of holes in the matrix;
a second step of filling the plurality of formed holes with a conductive material for forming the conductive elements so as to be flush with the sides of the insulating layer or to protrude from the sides; and a third step of removing the base." Patent Document 4 also carries out investigations on various materials (e.g., polyimide resins, epoxy resins and silicone resins) for the insulating layer.

However, with the increasing trend in recent years toward higher integration, electrode (terminal) sizes in electronic components such as semiconductor devices are becoming smaller, the number of electrodes (terminals) is increasing, and the distance between terminals is becoming smaller. Moreover, there have also appeared electronic components having a surface construction wherein the surface on each of the numerous terminals arranged at a narrow pitch lies at a position that is more recessed than the surface of the component itself.

In order to be able to adapt to such electronic components, there has arisen a need to make the outer diameter (thickness) of the conductive paths in anisotropic conductive members smaller and to arrange the conductive paths at a narrower pitch.

However, in the methods of manufacturing the anisotropic conductive films and electrically connecting members described in Patent Documents 1 to 4, it has been very difficult to reduce the size of the conductive paths. A method of filling the conductive material suitable to the narrow pitch at a high density is expected.

Patent Document 1: JP 2000-012619 A;
Patent Document 2: JP 2005-085634 A;
Patent Document 3: JP 2002-134570 A;
Patent Document 4: JP 03-182081 A;

DISCLOSURE OF THE INVENTION

Problems to be Solved by the Invention

Therefore, an object of the invention is to provide an anisotropic conductive joint package in which an anisotropic conductive film is joined to a wiring substrate, that is, an element made of, for example, gold (Au), silver (Ag), copper (Cu), aluminum (Al), magnesium (Mg), nickel (Ni), an indium-doped tin oxide (hereinafter abbreviated as "ITO"), molybdenum (Mo), iron (Fe), Pd (palladium), beryllium (Be) or rhenium (Re).

Means for Solving the Problems

The inventors of the invention have made an intensive study to achieve the above object and as a result could develop an anisotropic conductive joint package having excellent reliability for the electric conductivity by controlling the joint temperature, load and time.

Specifically, the invention provides the following (1) to (9).
(1) An anisotropic conductive joint package in which an anisotropic conductive film is joined to a conductive element of at least one material selected from the group consisting of gold (Au), silver (Ag), copper (Cu), aluminum (Al), magnesium (Mg), nickel (Ni), an indium-doped tin oxide (hereinafter abbreviated as "ITO"), molybdenum (Mo), iron (Fe), Pd (palladium), beryllium (Be) and rhenium (Re). A transparent conductive film may be used for the conductive element of the invention. Exemplary conductive materials of the invention that may be used as the transparent conductive film materials include indium oxide-, zinc oxide-, and tin oxide-based known materials.

The anisotropic conductive film has an insulating base and conductive paths composed of a conductive material, insulated from one another, and extending through the insulating base in the thickness direction of the insulating base, one end of each of the conductive paths is exposed on one side of the insulating base, and the other end of each of the conductive paths is exposed on the other side thereof.

The density of the conductive paths is 3,000,000 pieces/mm$^2$ or more, and the insulating base is a structure composed of an anodized film of an aluminum substrate having micropores.

The micropores do not have a branched structure in their depth direction.
(2) The anisotropic conductive joint package according to (1), wherein the anisotropic conductive film is one in which areas where micropores are filled with the conductive material and areas where no micropores are filled with the conductive material are patterned.
(3) The anisotropic conductive joint package according to (1) or (2), having an insulating base thickness of from 1 to 1000 μm and a conductive path diameter of from 5 to 500 nm.
(4) The anisotropic conductive joint package according to any one of (1) to (3), wherein two conductive element layers are provided via the anisotropic conductive film and an adhesive composition is filled into a layer containing the anisotropic conductive film located between the two conductive element layers.
(5) The anisotropic conductive joint package according to any one of (1) to (3), wherein at least two conductive element layers and at least two anisotropic conductive film layers are alternately stacked and an adhesive composition is filled into a layer containing the anisotropic conductive film between the respective conductive element layers.
(6) The anisotropic conductive joint package according to any one of (1) to (5), wherein at least one of the conductive element layers comprises an electrode which is electrically connected to internal wiring of an interposer and is disposed on one surface of the interposer.
(7) A method of manufacturing the anisotropic conductive joint package according to any one of (1) to (6), wherein joining is made to establish electrical connection between the anisotropic conductive film and the conductive element or between the anisotropic conductive film and the two conductive element layers via the anisotropic conductive film.
(8) The method of manufacturing the anisotropic conductive joint package according to (7), wherein the method used for joining is thermocompression bonding and the compression bonding temperature is from 140° C. to 800° C., the compression bonding pressure per unit electrode area is from 1 MPa to 500 MPa, and the compression bonding time is from 5 seconds to 10 minutes.
(9) The method of manufacturing the anisotropic conductive joint package according to (7) or (8), wherein the atmosphere during the joining by the thermocompression bonding is in a vacuum of at least 10$^{-1}$ Pa.

Effects of the Invention

As will be described later, this invention is capable of providing an anisotropic conductive joint package that dramatically increases the conductive path density and can be used as an anisotropic conductive member or inspection connector for electronic components such as semiconductor devices in which still higher levels of integration have been achieved, as well as a method of manufacturing such an anisotropic conductive joint package.

The anisotropic conductive film used in the invention has conductive members at a very high density, has high connection reliability and has nano-order conductive protrusions (bumps), and is therefore capable of manufacturing an anisotropic conductive joint package having highly reliable conductivity by compression bonding at lower temperatures under the anchor effect and by the effect of metal diffusion to the connecting member and is very useful.

BRIEF DESCRIPTION OF THE DRAWINGS

FIG. 5 shows cross-sectional views of an anisotropic conductive joint package of the invention having interposers disposed in two layers on the upper and lower sides.

BEST MODE FOR CARRYING OUT THE INVENTION

The anisotropic conductive joint package of the invention is a package in which an anisotropic conductive film is joined to conductive elements. The joint between the conductive elements and the anisotropic conductive film is not particularly limited and if they are joined to each other in a state in which an electrical connection is possible, the resistance of the conductive elements per penetrating electrode is not more than 50Ω, preferably not more than 10Ω, and more preferably not more than 8Ω, as will be described later.

The structure of the anisotropic conductive joint package 10 of the invention is first described with reference to FIGS. 3, 4 and 6, but the invention is not limited to the structure shown in these drawings.

Figure 3A:
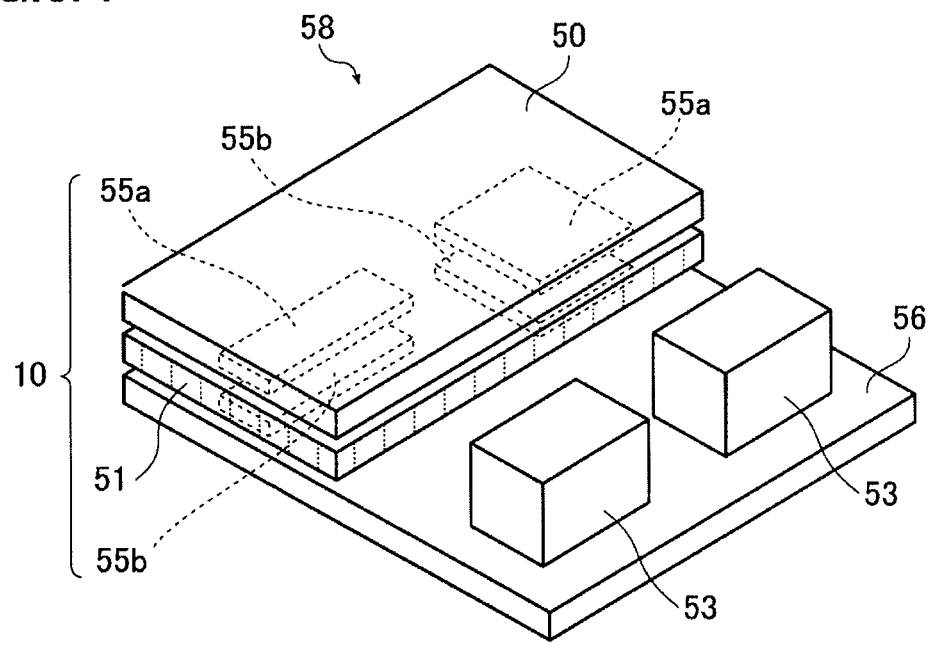
FIG. 3A is a perspective view showing a multi-chip module 58 using an anisotropic conductive joint package 10 of the invention.
Figure 3B:
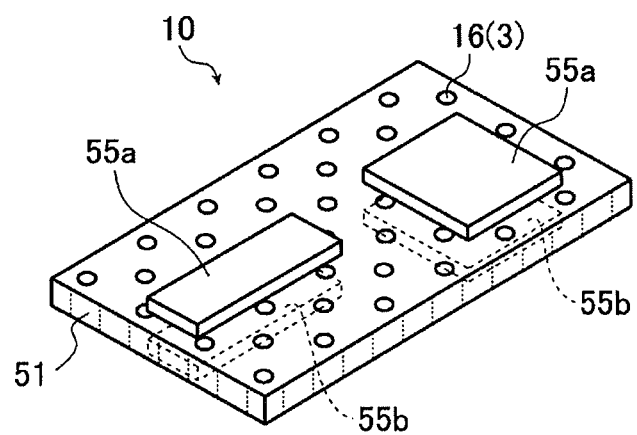
FIG. 3B is a perspective view illustrating the anisotropic conductive joint package 10 extracted from FIG. 3A.

FIG. 3A is a perspective view showing a multi-chip module 58 using the anisotropic conductive joint package 10 of the invention. FIG. 6 is a cross-sectional view showing a multi-chip module 58 similar to that shown in FIG. 3A. FIG. 3B illustrates the anisotropic conductive joint package 10 extracted from FIG. 3A.

Figure 6:
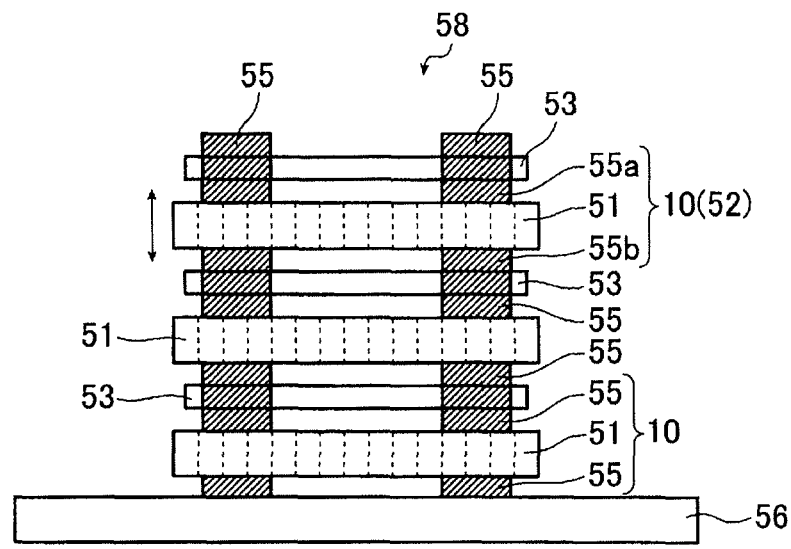
FIG. 6 is a cross-sectional view showing a multi-chip module using the anisotropic conductive joint package of the invention.

The multi-chip module 58 of FIG. 6 is, for example, DRAM (Dynamic Random Access Memory) and three layers of IC chips 53 which are penetrating electrode substrates are electrically connected to each other on a base substrate 56 via the anisotropic conductive joint packages 10 of the invention. More specifically, electrodes 55a on one side and electrodes 55b on the other side which make up conductive elements 55 are electrically connected to each other via an anisotropic conductive film 51 to form the anisotropic conductive joint package 10 of the invention. The base substrate 56 is overlaid with the first anisotropic conductive joint package 10, which is overlaid with the first IC chip, which is sequentially overlaid with the second anisotropic conductive joint package 10, the second IC chip, the third anisotropic conductive joint package 10, and the third IC chip, which, in turn, is overlaid with the electrodes 55, and these elements are electrically connected to form the multi-chip module 58 of FIG. 6. In addition to the IC chips 53, the penetrating electrode substrates such as wiring substrates and interposers may be used.

The multi-chip module 58 of FIG. 3A is attached to a circuit board of any device for electrical connection, and includes the base (chip) substrate 56, the two IC chips 53 and an interposer 50 connected to the anisotropic conductive joint package 10 of the invention.

The chip substrate 56 is made up of a printed circuit board and unshown electrodes in the printed circuit board are electrically connected to the IC chips 53 through unshown wiring. The anisotropic conductive joint package 10 of the invention is disposed on the chip substrate 56 and has the electrodes 55b on one surface side and the electrodes 55a on the other surface side. The electrodes 55a are connected to internal wiring of the interposer 50 and are counter electrodes of the electrodes 55b. In the anisotropic conductive joint package 10, the electrodes 55a are electrically connected to the electrodes 55b through conductive paths 3 of the anisotropic conductive film 51 which are formed from micropores 16 having no branched structure.

Figure 4:
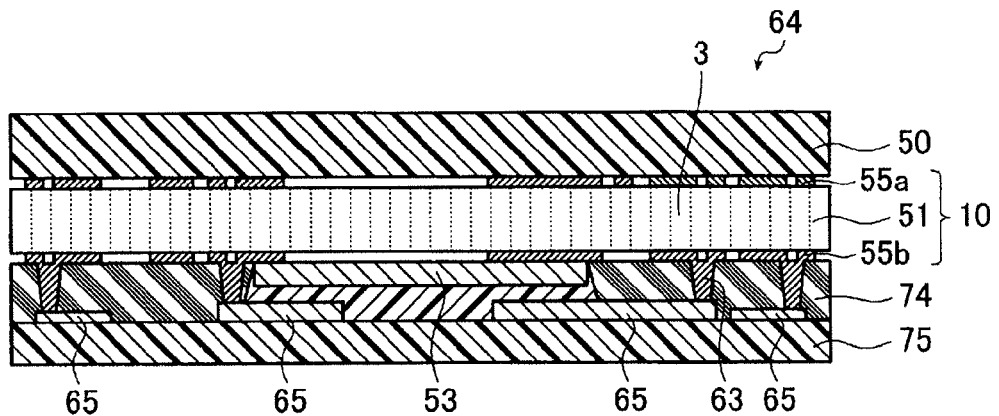
FIG. 4 is a cross-sectional view showing a semiconductor device 64 in which the anisotropic conductive joint package 10 of the invention is used instead of forming via holes 63.

FIG. 4 is a cross-sectional view showing a semiconductor device 64 in which the anisotropic conductive joint package 10 of the invention is used instead of forming via holes 63.

The semiconductor device 64 includes electrodes 65 and the IC chips 53 on an interposer 75 and has a rewiring layer 74 electrically connected to the electrodes 55b on the other surface side through the via holes 63.

The anisotropic conductive joint package 10 of the invention is disposed on the rewiring layer 74, and include the electrodes 55b on one surface side and the electrodes 55a on the other surface side, the electrodes 55a being the counter electrodes of the electrodes 55b and being connected to the internal wiring of the interposer 50.

In the anisotropic conductive joint package 10, the electrodes 55a are electrically connected to the electrodes 55b through the conductive paths 3 of the anisotropic conductive film 51 which are formed from the micropores 16 having no branched structure.

Simple electrical connection using the conductive paths 3 is possible without forming the via holes 63 in a complicated process as in the illustrated rewiring layer 74.

In the anisotropic conductive joint package 10 of the invention, two layers, three layers or more, or multiple layers of conductive elements may be provided through the anisotropic conductive film(s), and an adhesive composition may be or may not be filled into a layer 52 including the anisotropic conductive film between the respective conductive element layers (between the electrode 55a on one side and the electrode 55b on the other side via the anisotropic conductive film 51 in the case shown in FIG. 6; the electrodes themselves and the layer may be or may not be included). Multilayer stacking enables the heat dissipation properties to be improved, thus enhancing the device reliability.

Next, the anisotropic conductive film and its manufacturing method according to the invention are described in detail.

The anisotropic conductive film of the invention has an insulating base and a plurality of conductive paths made up of a conductive material, insulated from one another, and extending through the insulating base in the thickness direction of the insulating base, one end of each of the conductive paths is exposed on one side of the insulating base, the other end of each of the conductive paths is exposed on the other side thereof, the density of the conductive paths is 3,000,000 pieces/mm$^2$ or more, the insulating base is a structure composed of an anodized film of an aluminum substrate having micropores, and the micropores do not have a branched structure in the depth direction.

Next, the anisotropic conductive film 51 of the invention is described with reference to FIG. 1.

Figure 1A:
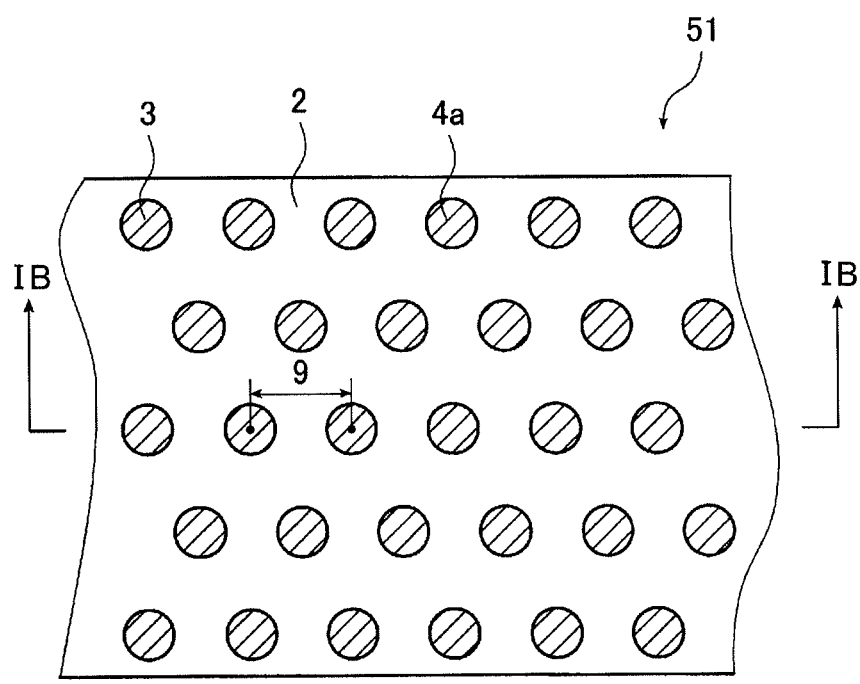
FIG. 1 schematically shows a preferred embodiment of an anisotropic conductive film of the invention.
Figure 1B:
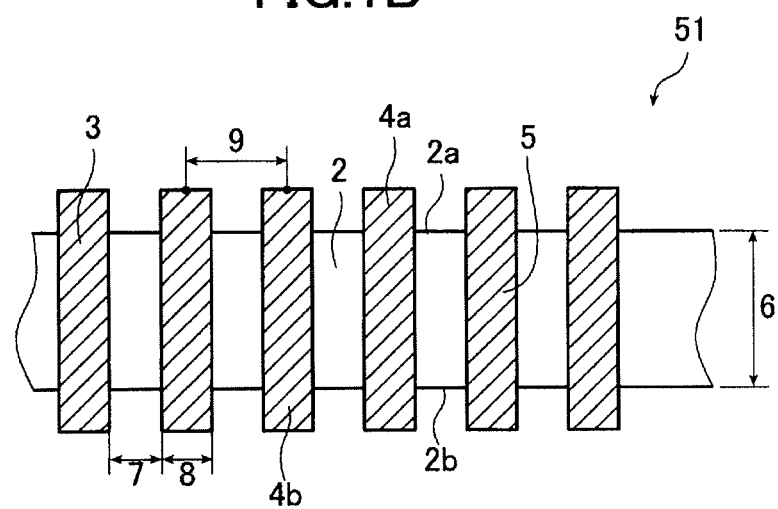

FIG. 1 shows simplified views of a preferred embodiment of the anisotropic conductive film of the invention. FIG. 1A is a front view and FIG. 1B is a cross-sectional view taken along the line IB-IB of FIG. 1A.

The anisotropic conductive film 51 of the invention includes an insulating base 2 and a plurality of conductive paths 3 made up of a conductive material.

The conductive paths 3 penetrate the insulating base 2 in a mutually insulated state so that the length in the axial direction is larger than the length (thickness) in the thickness direction Z of the insulating base 2 and the density is at least 3,000,000 pieces/mm$^2$.

Each conductive path 3 has one end exposed at one surface of the insulating base 2 and the other end exposed at the other surface of the insulating base 2, but as shown in FIG. 1B, each conductive path 3 preferably has one end protruded from the surface 2a on one side of the insulating base 2 and the other end protruded from the surface 2b on the other side of the insulating base 2. In other words, both the ends of each conductive path 3 preferably have protrusions 4a and 4b protruded from the main surfaces 2a and 2b of the insulating base, respectively.

In addition, each conductive path 3 is preferably formed so that at least the portion within the insulating base 2 (hereinafter also referred to as "conductive portion within the base 5") is substantially parallel (parallel in FIG. 1) to the thickness direction Z of the insulating base 2 in the anisotropic conductive film.

Next, the materials and sizes of the insulating base and the conductive paths and their forming method are described.

[Insulating Base]

The insulating base making up the anisotropic conductive film of the invention is a structure which has a micropore-bearing anodized film of an aluminum substrate and in which micropores are not branched in the depth direction of the film.

Therefore, the observation of the oxide film from the sectional direction can confirm only straight tube-shaped micropores. Accordingly, the ratio of the number of micropores A per unit area on one surface of the oxide film to the number of micropores B per unit area on the other surface of the oxide film (A/B) is preferably from 0.90 to 1.10, more preferably from 0.95 to 1.05, and most preferably from 0.98 to 1.02. The number of micropores can be obtained by observing the micropores by FE-SEM and counting the enlarged micropores.

Alumina used for the material of the film obtained by anodizing aluminum has an electric resistivity of about $10^{14}$ $\Omega \cdot cm$ as in the insulating base making up a conventionally known anisotropic conductive film (e.g., thermoelastic elastomer).

In the practice of the invention, the insulating base has a thickness (as shown in FIG. 1B by the reference symbol 6) of from 1 to 1000 μm, more preferably from 30 to 1000 μm and even more preferably from 50 to 300 μm. At an insulating base thickness within the foregoing range, the insulating base can be handled with ease.

In the practice of the invention, the width between neighboring conductive paths (the portion represented in FIG. 1B by the reference symbol 7) in the insulating base is preferably at least 10 nm, more preferably from 20 to 100 nm, and even more preferably from 20 to 50 nm. At a width between the conductive paths of the insulating base within the foregoing range, the insulating base functions fully as an insulating barrier.

In the practice of the invention, the insulating base can be manufactured, for example, by anodizing the aluminum substrate and perforating the micropores formed by anodization.

The anodizing treatment step and the perforating treatment step will be described in detail in the anisotropic conductive film-manufacturing method of the invention to be referred to later.

The anisotropic conductive film preferably has micropores at a degree of ordering as defined by formula (i) of at least 50%.

$$\text{Degree of ordering (\%)} = C/D \times 100 \quad \text{(i)}$$

In formula (i), D represents the total number of micropores in a measurement region, and C represents the number of specific micropores in the measurement region for which, when a circle is drawn so as to be centered on the center of gravity of a specific micropore and so as to be of the smallest radius that is internally tangent to the edge of another micropore, the circle includes centers of gravity of six micropores other than the specific micropore).

[Conductive Path]

The conductive paths making up the anisotropic conductive film of the invention comprise a conductive material.

The conductive material is not particularly limited as long as the material used has an electric resistivity of not more than $10^3$ $\Omega \cdot cm$. Illustrative examples of the conductive material that may be preferably used include gold (Au), silver (Ag), copper (Cu), aluminum (Al), magnesium (Mg), nickel (Ni), molybdenum (Mo), iron (Fe), Pd (palladium), beryllium (Be) and rhenium (Re).

Of these, in terms of electric conductivity, copper, gold, aluminum and nickel are preferred, copper and gold being more preferred.

In terms of cost, it is more preferable to use gold only for forming the surfaces of the conductive paths exposed at or protruded from both the surfaces of the insulating base (hereinafter also referred to as "end faces").

In the practice of the invention, the conductive paths are columnar and the diameter of the conductive paths (the portion represented in FIG. 1B by the reference symbol 8) is preferably from 5 to 500 nm, more preferably from 20 to 400 nm, even more preferably from 40 to 200 nm and most preferably from 50 to 100 nm. At a diameter of the conductive paths within the foregoing range, when electrical signals are passed through the conductive paths, sufficient responses can be obtained, thus enabling more preferable use of the anisotropic conductive member of the invention as an inspection connector for electronic components.

In the invention, when both the ends of the conductive path protrude from both the surfaces of the insulating base, the protrusions (in FIG. 1B, the portions represented by the reference symbols 4a and 4b; also referred to below as "bumps") have a height of preferably from 5 to 500 nm, and more preferably from 10 to 200 nm. At a bump height in this range, connectivity with the electrode (pads) on an electronic component improves.

In the invention, the conductive paths are insulated from each other by the insulating base. In cases where the anisotropic conductive film is one in which areas where micropores are filled with the conductive material and areas where no micropores are filled with a conductive material are patterned, the density of the conductive paths in the areas where the micropores are filled with the conductive material is at least $3 \times 10^6$ pieces/mm$^2$, preferably $10^7$ pieces/mm$^2$, more preferably at least $5 \times 10^7$ pieces/mm$^2$ and even more preferably at least $10^8$ pieces/mm$^2$. The density of the conductive paths in the areas where no micropores are filled with the conductive material is less than $3 \times 10^6$ pieces/mm$^2$, including the case of 0. The insulating base of the invention has the micropores at a density of $3 \times 10^6$ micropores/mm$^2$, preferably at least $10^7$ micropores/mm$^2$, more preferably at least $5 \times 10^7$ micropores/mm$^2$, and even more preferably at least $10^8$ micropores/mm$^2$.

At a density of the conductive paths within the foregoing range, the anisotropic conductive film of the invention can be used as inspection connectors and the conductive connecting members for electronic components such as semiconductor devices even today when still higher levels of integration have been achieved.

In the presence of the conductive paths at the foregoing density, the anisotropic conductive joint package of the invention may have an average resistance per penetrating electrode of not more than 50Ω, preferably not more than 10Ω and more preferably not more than 5Ω. Within this range, the anisotropic conductive joint package can be used as an anisotropic conductive member of highly integrated electronic components.

In the invention, the center-to-center distance between neighboring conductive paths (the portion represented in FIG. 1 by the reference symbol 9; also referred to below as the "pitch") is preferably from 30 to 500 nm, more preferably from 40 to 200 nm, and even more preferably from 50 to 140 nm. At a pitch in the foregoing range, a balance between the diameter of the conductive paths and the width between the conductive paths (insulating barrier thickness) is easily achieved.

In the practice of the invention, the conductive paths can be formed by filling a metal as a conductive material into the through micropores in the insulating base.

The metal filling treatment step will be described in detail in the anisotropic conductive film-manufacturing method of the invention to be referred to later.

As described above, the anisotropic conductive film of the invention preferably has an insulating base thickness of from 1 to 1000 μm and a conductive path diameter of from 5 to 500 nm, because electrical conduction can be confirmed at a high density while maintaining high insulating properties.

The anisotropic conductive film may be of a structure in which all the micropores are filled with a conductive material. Even in cases where filled areas and non-filled areas are mixed in a random manner, electrical connection between the anisotropic conductive film and the electrode is possible if the number of filled micropores reaches the required density. The anisotropic conductive film may be one in which areas where micropores are filled with a conductive material and areas where no micropores are filled with a conductive material are patterned. Patterning can prevent the conductive material from being filled into unnecessary portions, leading to cost reduction.

[Method of Manufacturing Anisotropic Conductive Joint Package]

The anisotropic conductive joint package of the invention is manufactured by joining a conductive element made of one or more than one material selected from among gold (Au), silver (Ag), copper (Cu), aluminum (Al), magnesium (Mg), nickel (Ni), ITO, molybdenum (Mo), iron (Fe), Pd (palladium), beryllium (Be) and rhenium (Re) to the anisotropic conductive film obtained by the manufacturing method described below. A transparent conductive film may be used for the conductive element of the invention. Exemplary conductive materials of the invention that may be used as the transparent conductive film materials include indium oxide-, zinc oxide-, and tin oxide-based known materials.

The method of manufacturing the anisotropic conductive film includes at least:

an anodizing treatment step in which an aluminum substrate is anodized;

a perforating treatment step in which micropores formed by anodization in the anodizing treatment step are perforated to obtain an insulating base; and a metal filling step which follows the perforating treatment step and in which a metal as a conductive material is filled into the through micropores in the resulting insulating base to obtain an anisotropic conductive film.

Next, an aluminum substrate that may be used in the invention, and each treatment step carried out on the aluminum substrate are described in detail.

[Aluminum Substrate]

The aluminum substrate that may be used in the inventive manufacturing method is not subject to any particular limitation. Illustrative examples include pure aluminum plate; alloy plates composed primarily of aluminum and containing trace amounts of other elements; substrates made of low-purity aluminum (e.g., recycled material) on which high-purity aluminum has been vapor-deposited; substrates such as silicon wafers, quartz or glass whose surface has been covered with high-purity aluminum by a process such as vapor deposition or sputtering; and resin substrates on which aluminum has been laminated.

Of the aluminum substrate of the invention, the surface on which an anodized film is to be formed by the anodizing treatment step to be described below has an aluminum purity of preferably at least 99.5 wt %, more preferably at least 99.9 wt % and even more preferably at least 99.99 wt %. It is preferable for the aluminum purity to fall within the above range, because the micropores are in a substantially straight-tube shape.

In the practice of the invention, the surface of the aluminum substrate on which the subsequently described anodizing treatment step is to be carried out is preferably subjected beforehand to degreasing treatment and mirror-like finishing treatment.

<Heat Treatment>

Heat treatment is preferably carried out at a temperature of from 200 to 350° C. for a period of about 30 seconds to about 2 minutes. Such heat treatment improves the orderliness of the micropore array formed by the subsequently described anodizing treatment step.

Following heat treatment, it is preferable to rapidly cool the aluminum substrate. The method of cooling is exemplified by a method involving direct immersion of the aluminum substrate in water or the like.

<Degreasing Treatment>

Degreasing treatment is carried out with a suitable substance such as an acid, alkali or organic solvent so as to dissolve and remove organic substances, including dust, grease and resins, adhering to the aluminum substrate surface, and thereby prevent defects due to organic substances from arising in each of the subsequent treatments.

Preferred degreasing methods include the following: a method in which an organic solvent such as an alcohol (e.g., methanol), ketone (e.g., methyl ethyl ketone), petroleum benzin or volatile oil is contacted with the surface of the aluminum substrate at ambient temperature (organic solvent method); a method in which a liquid containing a surfactant such as soap or a neutral detergent is contacted with the surface of the aluminum substrate at a temperature of from ambient temperature to 80° C., after which the surface is rinsed with water (surfactant method); a method in which an aqueous sulfuric acid solution having a concentration of 10 to 200 g/L is contacted with the surface of the aluminum substrate at a temperature of from ambient temperature to 70° C. for a period of 30 to 80 seconds, following which the surface is rinsed with water; a method in which an aqueous solution of sodium hydroxide having a concentration of 5 to 20 g/L is contacted with the surface of the aluminum substrate at ambient temperature for about 30 seconds while electrolysis is carried out by passing a direct current through the aluminum substrate surface as the cathode at a current density of 1 to 10 A/dm², following which the surface is contacted with an aqueous solution of nitric acid having a concentration of 100 to 500 g/L and thereby neutralized; a method in which any of various known anodizing electrolytic solutions is contacted with the surface of the aluminum substrate at ambient temperature while electrolysis is carried out by passing a direct current at a current density of 1 to 10 A/dm$^2$ through the aluminum substrate surface as the cathode or by passing an alternating current through the aluminum substrate surface as the cathode; a method in which an aqueous alkali solution having a concentration of 10 to 200 g/L is contacted with the surface of the aluminum substrate at 40 to 50° C. for 15 to 60 seconds, following which an aqueous solution of nitric acid having a concentration of 100 to 500 g/L is contacted with the surface and thereby neutralized; a method in which an emulsion prepared by mixing a surfactant, water and the like into an oil such as gas oil or kerosene is contacted with the surface of the aluminum substrate at a temperature of from ambient temperature to 50° C., following which the surface is rinsed with water (emulsion degreasing method); and a method in which a mixed solution of, for example, sodium carbonate, phosphates and surfactant is contacted with the surface of the aluminum substrate at a temperature of from ambient temperature to 50° C. for 30 to 180 seconds, following which the surface is rinsed with water (phosphate method).

Of these, the organic solvent method, surfactant method, emulsion degreasing method and phosphate method are preferred from the standpoint of removing grease from the aluminum surface while causing substantially no aluminum dissolution.

Known degreasers may be used in degreasing treatment. For example, degreasing treatment may be carried out using any of various commercially available degreasers by the prescribed method.

<Mirror-Like Finishing Treatment>

Mirror-like finishing treatment is carried out to eliminate surface asperities of the aluminum substrate and improve the uniformity and reproducibility of particle-forming treatment using, for example, electrodeposition. Exemplary surface asperities of the aluminum substrate include rolling streaks formed during rolling of the aluminum substrate which requires a rolling step for its manufacture.

In the practice of the invention, mirror-like finishing treatment is not subject to any particular limitation, and may be carried out using any suitable method known in the art. Examples of suitable methods include mechanical polishing, chemical polishing, and electrolytic polishing.

Illustrative examples of suitable mechanical polishing methods include polishing with various commercial abrasive cloths, and methods that combine the use of various commercial abrasives (e.g., diamond, alumina) with buffing. More specifically, a method which is carried out with an abrasive while changing over time the abrasive used from one having coarser particles to one having finer particles is appropriately illustrated. In such a case, the final abrasive used is preferably one having a grit size of 1500. In this way, a glossiness of at least 50% (in the case of rolled aluminum, at least 50% in both the rolling direction and the transverse direction) can be achieved.

Examples of chemical polishing methods include various methods mentioned in the 6th edition of Aluminum Handbook (Japan Aluminum Association, 2001), pp. 164-165.

Preferred examples include phosphoric acid/nitric acid method, Alupol I method, Alupol V method, Alcoa R5 method, $H_3PO_4$—$CH_3COOH$—Cu method and $H_3PO_4$—$HNO_3$—$CH_3COOH$ method. Of these, the phosphoric acid/nitric acid method, the $H_3PO_4$—$CH_3COOH$—Cu method and the $H_3PO_4$—$HNO_3$—$CH_3COOH$ method are especially preferred.

With chemical polishing, a glossiness of at least 70% (in the case of rolled aluminum, at least 70% in both the rolling direction and the transverse direction) can be achieved.

Examples of electrolytic polishing include various methods mentioned in the 6th edition of Aluminum Handbook (Japan Aluminum Association, 2001), pp. 164-165; the method described in U.S. Pat. No. 2,708,655; and the method described in Jitsumu Hyomen Gijutsu (Practice of Surface Technology), Vol. 33, No. 3, pp. 32-38 (1986).

With electrolytic polishing, a glossiness of at least 70% (in the case of rolled aluminum, at least 70% in both the rolling direction and the transverse direction) can be achieved.

These methods may be suitably combined and used. In an illustrative method that may be preferably used, mechanical polishing which is carried out by changing the abrasive over time from one having coarser particles to one having finer particles is followed by electrolytic polishing.

Mirror-like finishing treatment enables a surface having, for example, a mean surface roughness $R_a$ of 0.1 µm or less and a glossiness of at least 50% to be obtained. The mean surface roughness $R_a$ is preferably 0.03 µm or less, and more preferably 0.02 µm or less. The glossiness is preferably at least 70%, and more preferably at least 80%.

The glossiness is the specular reflectance which can be determined in accordance with JIS Z8741-1997 (Method 3: 60° Specular Gloss) in a direction perpendicular to the rolling direction. Specifically, measurement is carried out using a variable-angle glossmeter (e.g., VG-1D, manufactured by Nippon Denshoku Industries Co., Ltd.) at an angle of incidence/reflection of 60° when the specular reflectance is 70% or less, and at an angle of incidence/reflection of 20° when the specular reflectance is more than 70%.

[Anodizing Treatment Step]

The anodizing treatment step is a step for anodizing the aluminum substrate to form a micropore-bearing oxide film at the surface of the aluminum substrate.

Conventionally known methods may be used in anodizing treatment in the inventive manufacturing method but it is preferred to use a constant voltage process to be described later so that the micropores in the anodized film of the aluminum substrate may not have a branched structure. An anodized film having micropores at a higher degree of ordering may be formed by anodizing the substrate, removing the anodized film by film removal treatment to form regular pits at the surface of the aluminum substrate and carrying out anodizing treatment again by a known re-anodizing treatment process.

In a constant voltage process, an anodized film is formed at a low speed over an extended period of time (e.g., from several hours to well over ten hours). It is essential to control the voltage at a constant level because the micropore size is dependent on the voltage. The micropore is branched by changing the voltage.

The average flow velocity of electrolytic solution in anodizing treatment is preferably from 0.5 to 20.0 m/min, more preferably from 1.0 to 15.0 m/min, and even more preferably from 2.0 to 10.0 m/min. By carrying out anodizing treatment at the foregoing flow velocity, the micropores obtained may not have a branched structure.

The method for causing the electrolytic solution to flow under the above conditions is not subject to any particular limitation. For example, a method involving the use of a common agitator such as a stirrer may be employed. The use of a stirrer in which the stirring speed can be controlled with a digital display is particularly desirable because it enables the average flow velocity to be regulated. An example of such a stirrer is the Magnetic Stirrer HS-50D (manufactured by As One Corporation).

Anodizing treatment may be carried out by, for example, a method in which current is passed through the aluminum substrate as the anode in an aqueous solution having an acid concentration of from 1 to 10 wt %.

The solution used in anodizing treatment is preferably an acid solution. A solution of sulfuric acid, phosphoric acid, chromic acid, oxalic acid, sulfamic acid, benzenesulfonic acid, amidosulfonic acid, glycolic acid, tartaric acid, malic acid or citric acid is more preferred. Of these, a solution of sulfuric acid, phosphoric acid, or oxalic acid is especially preferred. These acids may be used singly or as combinations of two or more thereof.

The anodizing treatment conditions vary depending on the electrolytic solution employed, and thus cannot be strictly specified. However, the following conditions are generally preferred: an electrolytic solution concentration of from 0.1 to 20 wt %, a solution temperature of from −10 to 30° C., a current density of from 0.01 to 20 A/dm$^2$, a voltage of from 3 to 300 V, and an electrolysis time of from 0.5 to 50 hours. An electrolytic solution concentration of from 0.5 to 15 wt %, a solution temperature of from −5 to 25° C., a current density of from 0.05 to 15 A/dm$^2$, a voltage of from 5 to 250 V, and an electrolysis time of from 1 to 25 hours are more preferred. An electrolytic solution concentration of from 1 to 10 wt %, a solution temperature of from 0 to 20° C., a current density of from 0.1 to 10 A/dm$^2$, a voltage of from 10 to 200 V, and an electrolysis time of from 2 to 20 hours are even more preferred.

The treatment time in anodizing treatment is preferably from 0.5 minute to 16 hours, more preferably from 1 minute to 12 hours, and even more preferably from 2 minutes to 8 hours.

In the invention, the anodized film formed by such anodizing treatment preferably has a thickness of from 1 to 1000 μm, more preferably from 5 to 500 μm, and even more preferably from 10 to 300 μm.

In the invention, the anodized film formed by such anodizing treatment has an average micropore density of preferably from 50 to 1,500 micropores/μm$^2$.

It is preferable for the micropores to have a surface coverage of from 20 to 50%.

The surface coverage of the micropores is defined here as the ratio of the total surface area of the micropore openings to the surface area of the aluminum surface.

[Perforating Treatment Step]

The perforating treatment step is a step in which micropores formed by anodization in the above-described anodizing treatment step are perforated to obtain an insulating base.

More specifically, the perforating treatment step is carried out by, for example, a method in which the aluminum substrate after the anodizing treatment step is dissolved to remove the bottom of the anodized film, and a method in which the aluminum substrate and the anodized film in the vicinity of the aluminum substrate are cut after the anodizing treatment step. Next, the former method which is a preferred embodiment is described in detail.

<Dissolution of Aluminum Substrate>

A treatment solution which does not readily dissolve the anodized film (alumina) but readily dissolves aluminum is used for dissolution of the aluminum substrate after the anodizing treatment step.

That is, use is made of a treatment solution which has an aluminum dissolution rate of at least 1 μm/min, preferably at least 3 μm/min, and more preferably at least 5 μm/min, and has an anodized film dissolution rate of 0.1 nm/min or less, preferably 0.05 nm/min or less, and more preferably 0.01 nm/min or less.

Specifically, a treatment solution which includes at least one metal compound having a lower ionization tendency than aluminum, and which has a pH of 4 or less or 8 or more, preferably 3 or less or 9 or more, and more preferably 2 or less or 10 or more is used for immersion treatment.

Preferred examples of such treatment solutions include solutions which are composed of, as the base, an aqueous solution of an acid or an alkali and which have blended therein a compound of, for example, manganese, zinc, chromium, iron, cadmium, cobalt, nickel, tin, lead, antimony, bismuth, copper, mercury, silver, palladium, platinum or gold (e.g., chloroplatinic acid), or a fluoride or chloride of any of these metals.

Of the above, it is preferable for the treatment solution to be based on an aqueous solution of an acid and to have mixed therein a chloride compound.

Treatment solutions of an aqueous solution of hydrochloric acid into which mercury chloride has been mixed (hydrochloric acid/mercury chloride), and treatment solutions of an aqueous solution of hydrochloric acid into which copper chloride has been mixed (hydrochloric acid/copper chloride) are especially preferred from the standpoint of the treatment latitude.

There is no particular limitation on the composition of such treatment solutions. Illustrative examples of the treatment solutions include a bromine/methanol mixture, a bromine/ethanol mixture, and aqua regia.

Such a treatment solution preferably has an acid or alkali concentration of 0.01 to 10 mol/L and more preferably 0.05 to 5 mol/L.

In addition, such a treatment solution is used at a treatment temperature of preferably −10° C. to 80° C. and more preferably 0 to 60° C.

In the practice of the invention, dissolution of the aluminum substrate is carried out by bringing the aluminum substrate having undergone the anodizing treatment step into contact with the above-described treatment solution. Examples of the contacting method include, but are not limited to, immersion and spraying. Of these, immersion is preferred. The period of contact at this time is preferably from 10 seconds to 5 hours and more preferably from 1 minute to 3 hours.

<Removal of Bottom of Anodized Film>

The bottom of the anodized film after the dissolution of the aluminum substrate is removed by immersion in an aqueous acid or alkali solution. Removal of the bottom of the oxide film causes the micropores to extend therethrough.

The bottom of the anodized film is preferably removed by the method that involves previously immersing the anodized film in a pH buffer solution to fill the micropores with the pH buffer solution from the micropore opening side, and bringing the surface opposite from the openings (i.e., the bottom of the anodized film) into contact with an aqueous acid solution or aqueous alkali solution.

When this treatment is to be carried out with an aqueous acid solution, it is preferable to use an aqueous solution of an inorganic acid such as sulfuric acid, phosphoric acid, nitric acid or hydrochloric acid, or a mixture thereof. The aqueous acid solution preferably has a concentration of 1 to 10 wt %. The aqueous acid solution preferably has a temperature of 25 to 40° C.

When this treatment is to be carried out with an aqueous alkali solution, it is preferable to use an aqueous solution of at least one alkali selected from the group consisting of sodium hydroxide, potassium hydroxide and lithium hydroxide. The aqueous alkali solution preferably has a concentration of 0.1 to 5 wt %. The aqueous alkali solution preferably has a temperature of 20 to 35° C.

Specific examples of preferred solutions include a 40° C. aqueous solution containing 50 g/L of phosphoric acid, a 30° C. aqueous solution containing 0.5 g/L of sodium hydroxide, and a 30° C. aqueous solution containing 0.5 g/L of potassium hydroxide.

The time of immersion in the aqueous acid solution or aqueous alkali solution is preferably from 8 to 120 minutes, more preferably from 10 to 90 minutes and even more preferably from 15 to 60 minutes.

In cases where the film is previously immersed in a pH buffer solution, a buffer solution suitable to the foregoing acids/alkalis is used.

Figure 2A:
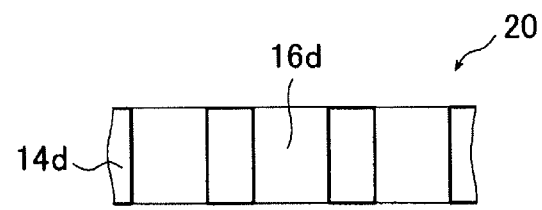
FIG. 2 shows schematic end views for illustrating a metal filling step and other steps in the manufacturing method of the invention.

This perforating treatment step yields a structure having no aluminum substrate or barrier layer, in other words, an insulating base 20 having micropores 16d formed in an anodized film 14d as shown in FIG. 2A.

[Metal Filling Step]

The metal filling step is a step in which a metal as a conductive material is filled into the through micropores in the resulting insulating base after the perforating treatment step to obtain an anisotropic conductive film.

The metal to be filled makes up the conductive paths of the anisotropic conductive film as described in connection with the anisotropic conductive film of the invention.

In the inventive manufacturing method, an electrolytic plating process or an electroless plating process may be used for the metal filling method.

In a conventionally known electrolytic plating process that is used for coloring or other purposes, it is difficult to selectively deposit (grow) metal inside micropores at a high aspect ratio, presumably because the deposited metal is consumed within the micropores and the plating does not grow even when electrolysis is carried out for at least a fixed period of time.

Therefore, in the inventive manufacturing method, when metal filling is carried out by the electrolytic plating process, it is necessary to provide rest periods during pulse electrolysis or constant potential electrolysis. The rest periods must be at least 10 seconds, and are preferably from 30 to 60 seconds.

To promote stirring of the electrolytic solution, it is desirable to apply ultrasound energy.

Moreover, the electrolysis voltage is generally not more than 20 V, and preferably not more than 10 V, although it is preferable to first measure the deposition potential of the target metal in the electrolytic solution to be used and carry out constant potential electrolysis at that potential+ not more than 1V. When carrying out constant potential electrolysis, it is desirable to use also cyclic voltammetry. To this end, use may be made of potentiostats such as those available from Solartron, BAS, Hokuto Denko and Ivium.

Plating may be carried out using a plating solution known in the art.

More specifically, when copper is to be deposited, an aqueous solution of copper sulfate may generally be used. The concentration of copper sulfate is preferably from 1 to 300 g/L, and more preferably from 100 to 200 g/L. Deposition can be promoted by adding hydrochloric acid to the electrolytic solution. In such a case, the concentration of hydrochloric acid is preferably from 10 to 20 g/L.

When gold is to be deposited, it is desirable to carry out plating by alternating current electrolysis using a sulfuric acid solution of a tetrachloroaurate.

According to the electroless plating process, it takes much time to completely fill the micropores having a high aspect ratio with a metal and it is therefore desirable to fill the metal by the electrolytic plating process in the inventive manufacturing method.

Figure 2B:
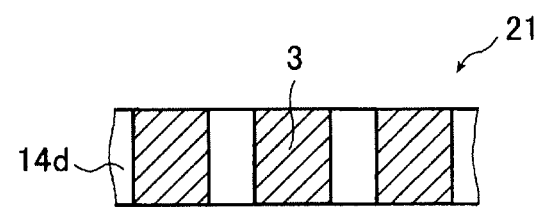

This metal filling step yields an anisotropic conductive film 21 shown in FIG. 2B.

An anisotropic conductive film in which areas where micropores are filled with a conductive material and areas where no micropores are filled with a conductive material are patterned may be manufactured by patterning using a mask, patterning electrodes for plating, or blocking with a resin the micropore surfaces which do not require plating in the electroless plating process and the electrolytic plating process.

[Surface Planarization]

In the inventive manufacturing method, the metal filling step is preferably followed by a surface planarization step in which the top side and the back side are planarized by chemical mechanical polishing.

By carrying out chemical mechanical polishing (CMP), the top and back sides after metal filling can be planarized while removing excess material adhering to the surfaces.

CMP treatment may be carried out using a CMP slurry such as PNANERLITE-7000 (available from Fujimi Inc.), GPX HSC800 produced by Hitachi Chemical Co., Ltd., or CL-1000 produced by AGC Seimi Chemical Co., Ltd.

It is not preferred to use a slurry for interlayer dielectric films and barrier metals, because the anodized film should not be polished.

[Trimming Treatment]

In the inventive manufacturing method, the metal filling step or the surface planarization step if the CMP treatment was carried out is preferably followed by a trimming step.

The trimming step is a step in which only part of the insulating base in the surfaces of the anisotropic conductive film is removed after the metal filling step or the surface planarization step if the CMP treatment was carried out to protrude the conductive paths from the anisotropic conductive film surfaces. Trimming treatment is preferably carried out immediately before joining treatment to be described later because unwanted oxide film is not formed on the surfaces of the conductive paths.

Trimming treatment is carried out by immersion in an aqueous acid or alkali solution under the condition that a metal making up the conductive paths is not dissolved.

When this treatment is to be carried out with an aqueous acid solution, it is preferable to use an aqueous solution of an inorganic acid such as sulfuric acid, phosphoric acid, nitric acid or hydrochloric acid, or a mixture thereof. The aqueous acid solution preferably has a concentration of 1 to 10 wt %. The aqueous acid solution preferably has a temperature of 25 to 40° C.

When this treatment is to be carried out with an aqueous alkali solution, it is preferable to use an aqueous solution of at least one alkali selected from the group consisting of sodium hydroxide, potassium hydroxide and lithium hydroxide. The aqueous alkali solution preferably has a concentration of 0.1 to 5 wt %. The aqueous alkali solution preferably has a temperature of 20 to 35° C.

Specific examples of preferred solutions include a 40° C. aqueous solution containing 50 g/L of phosphoric acid, a 30° C. aqueous solution containing 0.5 g/L of sodium hydroxide, and a 30° C. aqueous solution containing 0.5 g/L of potassium hydroxide. Trimming treatment can be performed under the treatment conditions of oxide film dissolution treatment. It is particularly preferred to use phosphoric acid with which the dissolution rate is readily controlled.

Figure 2C:
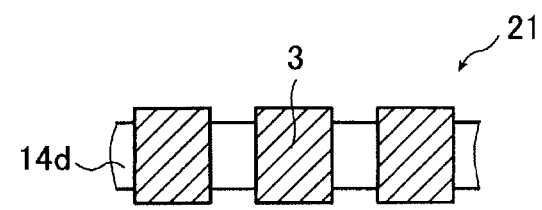

The trimming step yields the anisotropic conductive member 21 shown in FIG. 2C.

Figure 2D:
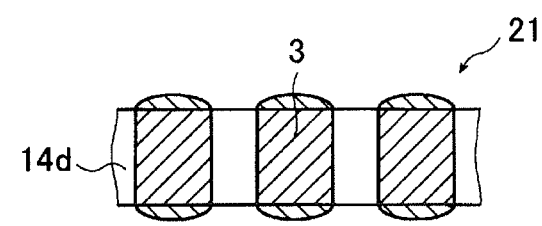

In the inventive manufacturing method, the trimming step may be replaced by an electrodeposition step in which a conductive metal which is the same as or different from the one filled into the micropores is further deposited only on the surfaces of the conductive paths 3 shown in FIG. 2B (FIG. 2D).

[Protective Film-Forming Treatment]

In the inventive manufacturing method, the micropore size changes with time by the hydration of the insulating base made of alumina with moisture in the air and therefore protective film-forming treatment is preferably carried out before the metal filling step.

Illustrative examples of protective films include inorganic protective films containing elemental zirconium and/or elemental silicon, and organic protective films containing a water-insoluble polymer.

The method of forming an elemental zirconium-containing protective film is not subject to any particular limitation, although a commonly used method of treatment involves direct immersion in an aqueous solution in which a zirconium compound is dissolved. From the standpoint of the strength and stability of the protective film, the use of an aqueous solution in which a phosphorus compound has also been dissolved is preferred.

Illustrative examples of the zirconium compound that may be used include zirconium, zirconium fluoride, sodium hexafluorozirconate, calcium hexafluorozirconate, zirconium fluoride, zirconium chloride, zirconium oxychloride, zirconium oxynitrate, zirconium sulfate, zirconium ethoxide, zirconium propoxide, zirconium butoxide, zirconium acetylacetonate, tetrachlorobis(tetrahydrofuran)zirconium, bis(methylcyclopentadienyl)zirconium dichloride, dicyclopentadienylzirconium dichloride and ethylenebis(indenyl)zirconium (IV) dichloride. Of these, sodium hexafluorozirconate is preferred.

From the standpoint of the uniformity of the protective film thickness, the concentration of the zirconium compound in the aqueous solution is preferably from 0.01 to 10 wt %, and more preferably from 0.05 to 5 wt %.

Illustrative examples of the phosphorus compound that may be used include phosphoric acid, sodium phosphate, calcium phosphate, sodium hydrogen phosphate and calcium hydrogen phosphate. Of these, sodium hydrogen phosphate is preferred.

From the standpoint of the uniformity of the protective film thickness, the concentration of the zirconium compound in the aqueous solution is preferably from 0.1 to 20 wt %, and more preferably from 0.5 to 10 wt %.

The treatment temperature is preferably from 0 to 120° C., and more preferably from 20 to 100° C.

The method of forming a protective film containing elemental silicon is not subject to any particular limitation, although a commonly used method of treatment involves direct immersion in an aqueous solution in which an alkali metal silicate is dissolved.

The thickness of the protective film can be adjusted by varying the ratio between the silicate ingredients silicon dioxide $SiO_2$ and alkali metal oxide $M_2O$ (generally represented as the molar ratio $[SiO_2]/[M_2O]$) and the concentrations thereof in the aqueous solution of an alkali metal silicate.

It is especially preferable here to use sodium or potassium as M.

The molar ratio $[SiO_2]/[M_2O]$ is preferably from 0.1 to 5.0, and more preferably from 0.5 to 3.0.

The $SiO_2$ content is preferably from 0.1 to 20 wt %, and more preferably from 0.5 to 10 wt %.

The organic protective film is preferably obtained by a method which involves direct immersion in an organic solvent in which a water-insoluble polymer is dissolved, followed by heating treatment to evaporate off only the solvent.

Illustrative examples of the water-insoluble polymer include polyvinylidene chloride, poly(meth)acrylonitrile, polysulfone, polyvinyl chloride, polyethylene, polycarbonate, polystyrene, polyamide and cellophane.

Illustrative examples of the organic solvent include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene.

The concentration is preferably from 0.1 to 50 wt %, and more preferably from 1 to 30 wt %.

The heating temperature during solvent evaporation is preferably from 30 to 300° C., and more preferably from 50 to 200° C.

Following protective film-forming treatment, the anodized film including the protective film has a thickness of preferably from 1 to 1000 μm, and more preferably from 1 to 500 μm.

In the inventive manufacturing method, the hardness and the heat cycle resistance can be controlled by carrying out heating treatment depending on the application of the anisotropic conductive member obtained.

For example, the heating temperature is preferably at least 100° C., more preferably at least 200° C. and even more preferably at least 400° C. The heating time is preferably from 10 seconds to 24 hours, more preferably from 1 minute to 12 hours and even more preferably from 30 minutes to 8 hours. Such heating treatment improves the hardness while suppressing the expansion and contraction during the heat cycle of heating and cooling in the semiconductor manufacturing step.

[Packaging by Joining to Conductive Element]

In the practice of the invention, the anisotropic conductive joint package is manufactured by joining for packaging, conductive elements made of one or more than one material selected from among gold (Au), silver (Ag), copper (Cu), aluminum (Al), magnesium (Mg), nickel (Ni), ITO, molybdenum (Mo), iron (Fe), Pd (palladium), beryllium (Be) and rhenium (Re) to the anisotropic conductive film obtained as described above. A transparent conductive film is used as a transparent electrode formed on a substrate in FPDs such as liquid crystal display (LCD) devices, plasma display panels (PDP), and electroluminescent displays (ELDs) including organic EL devices. The transparent conductive film is made of known materials including indium oxide-, zinc oxide- and tin oxide-based materials. ITO (indium oxide doped with tin) is a well known and widely used indium oxide-based material. Examples of the conductive element of the invention include transparent conductive films made of these known indium oxide-, zinc oxide- and tin oxide-based materials.

The joining system is not particularly limited but in terms of high electrical conduction reliability during the joining, compression bonding is preferred and thermocompression bonding is more preferred. Ultrasonic bonding is also preferred.

[Compression Bonding]

As for the load for compression bonding, the pressure per unit electrode area is preferably from 1 MPa to 500 MPa. The pressure per unit electrode area is more preferably from 100 to 500 MPa. The connecting portion has low electrical conduction reliability at a smaller load than the above range, whereas the anisotropic conductive film itself and/or the electrode is broken at a larger load than the above range. The both cases are therefore not preferred.

The compression bonding time is preferably from 5 seconds to 10 minutes, more preferably from 10 seconds to 7 minutes, and most preferably from 30 seconds to 5 minutes. The connecting portion has low electrical conduction reliability at a shorter time than the above range, whereas there is no marked improvement in the connectivity at a longer time than the above range. The both cases are therefore not preferred.

In cases where thermocompression bonding is applied, the connectivity can be controlled by the temperature in addition to the foregoing ranges. The thermocompression bonding temperature is preferably from 140° C. to 800° C., more preferably from 160° C. to 500° C., and most preferably from 180° C. to 300° C. The connecting portion has low electrical conduction reliability at a lower temperature than the above range, whereas the anisotropic conductive film itself is broken at a higher temperature than the above range. The both cases are therefore not preferred.

In terms of improving the joint strength, the atmosphere during the joining is preferably closer to vacuum. The pressure is preferably not more than $10^{-1}$ Pa, more preferably not more than $10^{-3}$ Pa and most preferably not more than $10^{-5}$ Pa.

[Ultrasonic Bonding]

A moderate degree of pressure is applied to the joint surface to cause parallel vibrations, inducing atomic diffusion to bond and join the mutual metal atoms. Local slip, elastic deformation and plastic deformation occur on the contacting metal surface to cause an increase in the temperature but there is no melting during the welding. The temperature increases to 35% to 50% of the metal melting point at which joining is usually made. An oxide film or stains adhere to the metal surface to be welded but are broken and diffused by the initial vibrations, whereby the clean surfaces come into contact with each other and further continued vibrations induce atomic diffusion. A wedge lead system or a lateral drive system may be used.

[Specific Examples of Conductive Element]

Specific examples of the conductive element include electrodes. The electrodes may be formed in any member, but are preferably joined to one and the other surfaces of the anisotropic conductive film of the invention and connected to the internal wiring of the interposers.

The interposer is also called conversion substrate or rewiring substrate and the electrode layout can be designed as desired depending on the layout of the external electrodes connected to its surface by the internal wiring of the substrate. The members of the interposer other than the electrodes can be made of inorganic compounds as in silicon wafers and GaN substrates, and various plastics such as glass fiber impregnated with epoxy resin and polyimide resin. The electrode portion can be produced by using one or more than one material selected from among gold (Au), silver (Ag), copper (Cu), aluminum (Al), magnesium (Mg), nickel (Ni), ITO, molybdenum (Mo), iron (Fe), Pd (palladium), beryllium (Be) and rhenium (Re).

The interposer may be joined to one surface of the anisotropic conductive joint package of the invention, but is preferably joined to the two layers on the upper and lower sides of the anisotropic conductive joint package as the intermediate layer.

Figure 5A:
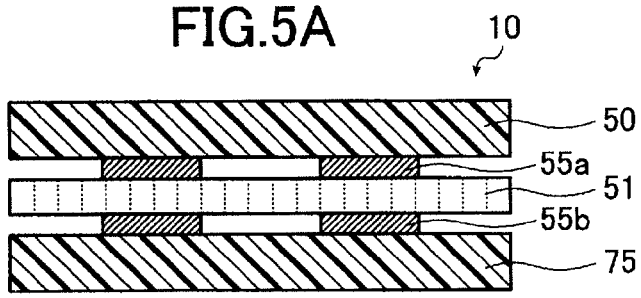
FIGS. 5A to 5C show different embodiments.
Figure 5B:
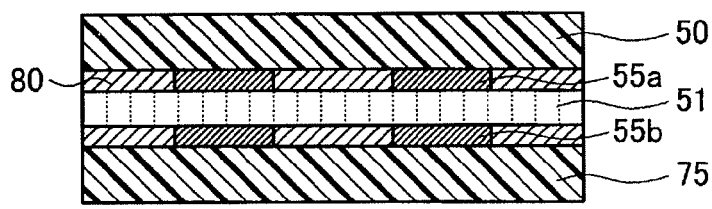

FIG. 5 shows cross-sectional views of an anisotropic conductive joint package of the invention having the interposers disposed in two layers on the upper and lower sides. FIG. 5A shows the anisotropic conductive joint package 10 of the invention in which the electrodes 55a and 55b are joined to one surface and the other surface of the anisotropic conductive film 51 between the interposers 50, 75, respectively. FIG. 5B shows the anisotropic conductive joint package 10 in which an underfill 80 as an adhesive resin composition is filled into the layers including the anisotropic conductive film between the two layers of interposers of FIG. 5A.

[Adhesive Composition]

Commercially available products may be used for the adhesive composition, and semiconductor adhesives commonly called underfill materials (in liquid form), NCP (in paste form) and NCF (in film form) are preferred. These adhesive compositions are preferred because the thermal expansion coefficient is adjusted so as to match the substrate and delamination due to the repetitive thermal stress applied to the substrate does not readily occur.

Specific Trade Names:

Liquid sealant, Model No. CEL-C-3900 available from Hitachi Chemical Co., Ltd.;

Non-conductive film (NCF) for use in Flip Chip sealing, Model No. T693/R6000 series available from Nagase ChemteX Corporation;

Non-conductive paste (NCP) for use in Flip Chip pressure bonding, Model No. T693/UFR series available from Nagase ChemteX Corporation;

Underfill T693/R3000 series for use in Flip Chip liquid sidefill available from Nagase ChemteX Corporation;

Underfill, trade name: ThreeBond; Model Nos. 2202, 2274, 2274B available from ThreeBond Co., Ltd.

Figure 5C:
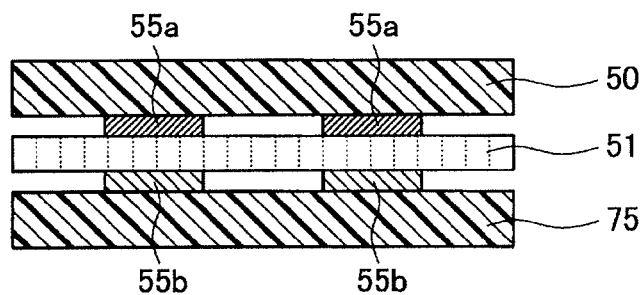

FIG. 5C shows the joint member (anisotropic conductive joint package) in which the electrodes 55a and 55b of FIG. 5A are made of different metals.

The electrodes 55a and the electrodes 55b may be disposed in the same or different manner, but it is necessary that the electrode 55a and the electrode 55b to be electrically connected at least partially overlap at the horizontal positions, whereas the electrodes not to be electrically connected be apart from each other at the horizontal positions, because the anisotropic conductive film of the invention has the conductive paths at a density of at least 3,000,000 pieces/mm$^2$ in the thickness direction of the film.

Figure 7:
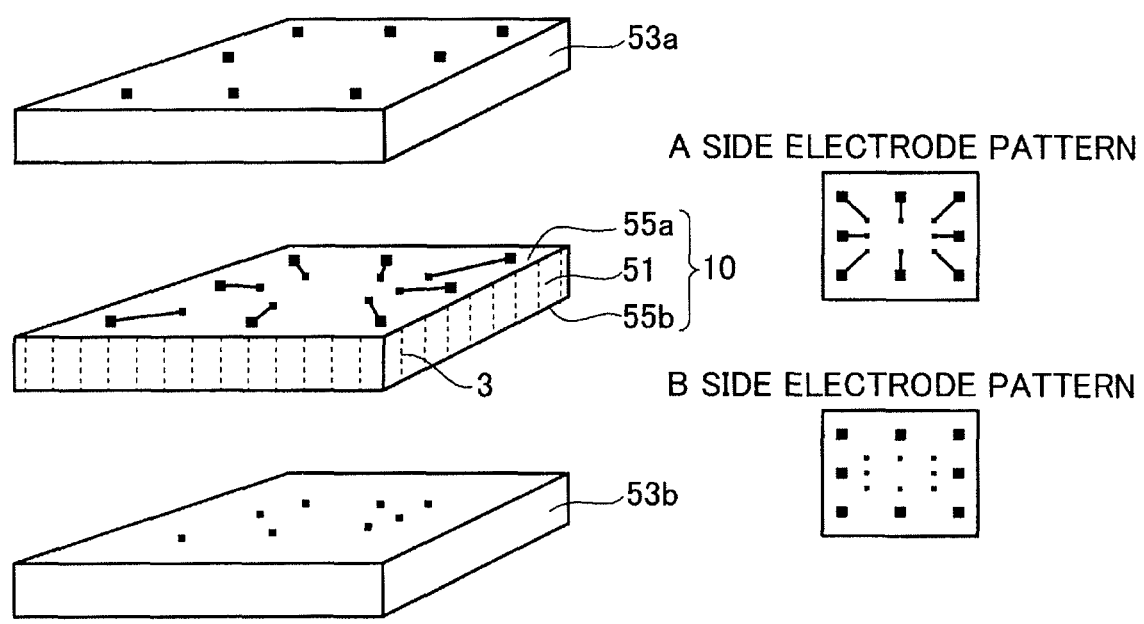
FIG. 7 is a perspective view showing another embodiment of the anisotropic conductive joint package of the invention.

FIG. 7 is a perspective view of the anisotropic conductive joint package 10 of the invention used to electrically connect an IC chip 53a having a first pitch or normal pitch penetrating electrodes, and an IC chip 53b having a second pitch or narrow pitch penetrating electrodes. An anisotropic conductive film 51 has conductive paths 3 patterned at positions corresponding to the second pitch or narrow pitch penetrating electrodes, and has a B side electrode pattern 55b on one surface thereof. The B side electrode pattern may be the electrode pattern on the surface of the IC chip 53b having the narrow pitch penetrating electrodes, but the electrodes may be provided at positions corresponding to both of the normal pitch electrodes and the narrow pitch penetrating electrodes as shown in FIG. 7 as the B side electrode pattern 55b. On the other hand, the A side electrode pattern 55a is of a configuration in which the normal pitch electrodes and the narrow pitch penetrating electrodes in the B side electrode pattern are electrically connected to each other to form a wiring pattern having the corresponding pairs. By using the anisotropic conductive joint package 10 of such a configuration, devices having different pitches such as the IC chips 53a and 53b can also be easily connected electrically and stacked, because the areas where micropores are filled with a conductive material and the areas where no micropores are filled with a conductive material are patterned in the anisotropic conductive film 51, and the A side electrode pattern 55a has wiring connecting the penetrating electrodes of different pitches to each other.

Figure 8:
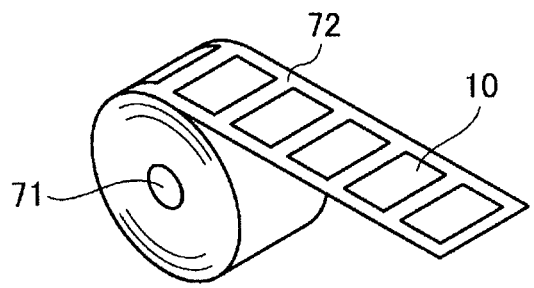
FIG. 8 is a schematic view illustrating an example as to how the anisotropic conductive joint package of the invention is supplied.

As in a label on a product indicating the price or the date, the anisotropic conductive joint package of the invention can be supplied in the form in which the anisotropic conductive joint package 10 of a specified size is stuck to the outside surface of a tape (mount) 72 wound around a core 71 having specified diameter and width (see FIG. 8).

The anisotropic conductive joint package is stuck to the tape, but the tape is preferably made of a material which prevents the adhesive from remaining on the surface of the anisotropic conductive member when it is peeled off.

In this supply form, users can peel off the anisotropic conductive joint packages stuck to the tape one by one and used.

Figure 9:
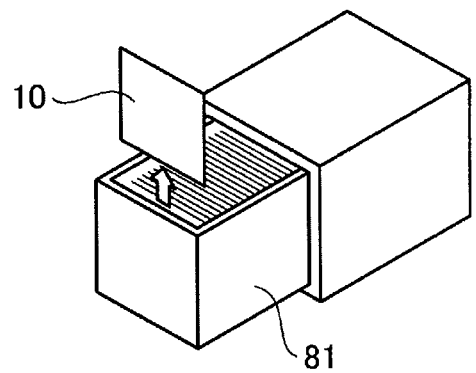
FIG. 9 is a schematic view illustrating another example as to how the anisotropic conductive joint package of the invention is supplied.

The anisotropic conductive joint package of the invention can also be supplied in a state in which the anisotropic conductive members 10 of a specified size are vertically arranged in a drawer type box 81 (see FIG. 9).

The neighboring anisotropic conductive joint packages come into contact with each other within the box. Therefore, the anisotropic conductive joint packages are desirably put into the box so as to prevent the neighboring anisotropic conductive joint packages from coming into contact with each other by inserting a cushioning material therebetween or packaging individual anisotropic conductive joint packages.

In this supply form, users can take out the anisotropic conductive joint packages from the box one by one and used.

Figure 10:
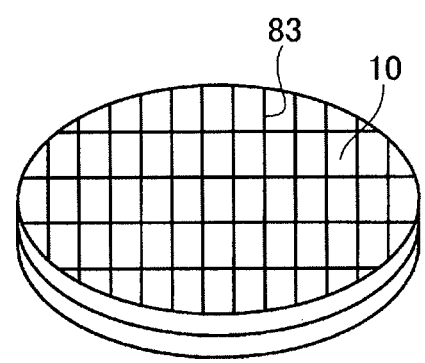
FIG. 10 is a schematic view illustrating still another example as to how the anisotropic conductive joint package of the invention is supplied.

As in the supply form of semiconductor devices, the anisotropic conductive joint package 10 of the invention is desirably such that a large number of anisotropic conductive joint packages sandwiched between two layers of upper and lower interposers be directly manufactured on a silicon substrate in a manufacturing setting, and slits 83 be made in advance as in the wafer level chip size packages of semiconductor chips so that they can be used after having been cut to a size substantially the same as that of semiconductor devices (see FIG. 10). In this supply form, users can cut the anisotropic conductive joint package along the slits and split it into individual elements to be used.

EXAMPLES

Examples 1 to 17 and Comparative Examples 1 to 4

(A) Mirror-Like Finishing Treatment (Electrolytic Polishing)

A high-purity aluminum substrate (Sumitomo Light Metal Industries, Ltd.; purity, 99.99 wt %; thickness, 0.4 mm) was cut to a size of 10 cm square that allows it to be anodized, then subjected to electrolytic polishing using an electrolytic polishing solution of the composition indicated below at a voltage of 25 V, a solution temperature of 65° C., and a solution flow velocity of 3.0 m/min.

A carbon electrode was used as the cathode, and a GP0110-30R unit (Takasago, Ltd.) was used as the power supply. In addition, the flow velocity of the electrolytic solution was measured using the vortex flow monitor FLM22-10PCW manufactured by As One Corporation.

(Electrolytic Polishing Solution Composition)

| | |
|---|---|
| 85 wt % Phosphoric acid (Wako Pure Chemical Industries, Ltd.) | 660 mL |
| Pure water | 160 mL |
| Sulfuric acid | 150 mL |
| Ethylene glycol | 30 mL |

(B) Anodizing Treatment Step

After electrolytic polishing, the aluminum substrate was subjected to 12 hours of anodizing treatment with an electrolytic solution of 0.20 mol/L sulfuric acid under the following conditions: voltage, 20 V; solution temperature, 10° C.; solution flow velocity, 3.0 m/min.

Anodizing treatment was carried out using a stainless steel electrode as the cathode and using a GP0110-30R unit (Takasago, Ltd.) as the power supply. In addition, use was made of NeoCool BD36 (Yamato Scientific Co., Ltd.) as the cooling system, and Pairstirrer PS-100 (Tokyo Rikakikai Co., Ltd.) as the stirring and warming unit. In addition, the flow velocity of the electrolytic solution was measured using the vortex flow monitor FLM22-10PCW (As One Corporation). The micropores obtained had a degree of ordering of 65%.

(C) Perforating Treatment Step

Next, the aluminum substrate was dissolved by 3 hours of immersion at 20° C. in a 20 wt % aqueous solution of mercuric chloride (corrosive sublimate). Then, the anodized film was immersed in 5 wt % phosphoric acid at 30° C. for 30 minutes to remove the bottom of the anodized film to thereby prepare a structure (insulating base) having a micropore-bearing anodized film.

(D) Heating Treatment

Next, the structure obtained as above was subjected to one hour of heating treatment at a temperature of 400° C.

(E) Metal Filling Treatment Step

Next, a cupper electrode was attached in close contact with one surface of the structure after the above-described heating treatment and electrolytic plating was carried out using the cupper electrode as the cathode and platinum as the anode.

A mixed solution of copper sulfate/sulfuric acid/hydrochloric acid=200/50/15 (g/L) held at 25° C. was used as the electrolytic solution to carry out constant-voltage pulse electrolysis, thereby manufacturing a structure having the micropores filled with copper (anisotropic conductive member).

An electroplating system manufactured by Yamamoto-MS Co., Ltd. and a power supply (HZ-3000) manufactured by Hokuto Denko Corp. were used to carry out constant-voltage pulse electrolysis. The deposition potential was checked by carrying out cyclic voltammetry in the plating solution, following which the film side potential was set to −2 V and electrolysis was carried out. The pulse waveform in constant-voltage pulse electrolysis was a square waveform. Specifically, electrolysis treatments lasting 60 seconds at a time were carried out a total of five times with 40-second rest periods between the respective treatments, so as to provide a total electrolysis treatment time of 300 seconds.

The surface of the structure filled with copper was observed by FE-SEM and as a result the copper was found to partially protrude from the surfaces of the anodized film.

(F) Surface Planarization Step

Next, CMP treatment was carried out on the top and back sides of the copper-filled structure.

PLANERLITE-7000 (available from Fujimi Inc.) was used as the CMP slurry.

(G) Trimming Treatment

The CMP-treated structure was then immersed in a phosphoric acid solution to selectively dissolve the anodized film, thereby causing the copper columns serving as the conductive paths to protrude from the surface.

The same phosphoric acid solution as in the above-described perforating treatment was used, and the treatment time was set to 5 minutes.

Then, the structure was rinsed with water, dried and observed by EF-SEM.

As a result, it was confirmed that the protruded portions of the conductive paths had a height (bump height) of 10 nm, the conductive path diameter which is the size of the electrode portion was 30 nm, the member had a thickness of 100 μm, the conductive paths did not have a branched structure, and the ratio of the number of micropores A per unit area on one surface of the oxide film to the number of micropores B per unit area on the other surface of the oxide film (A/B) was 1.0. The density of the conductive paths was 62,000,000 pieces/mm$^2$.

The insulation resistance of the structure having a micropore-bearing anodized film (insulating base) as measured in the planar direction of the structure was at least $10^{14}$ Ω·cm, which showed that the insulating properties were sufficient.

(H) Joint Packaging

The anisotropic conductive film obtained as above was adhered to flat glass with hot-melt resin (trade name: Aqua Wax available from MARUTO INSTRUMENT CO., LTD.) and cut with a diamond cutter to a sample size of 7 cm square (sample area: 49 cm$^2$). The hot-melt resin was dissolved in 40° C. hot water and removed to obtain an anisotropic conductive film with a size of 7 cm square.

A thermocompression bonding test was conducted using a thermocompression bonding device HVHC-PRESS (cylinder area: 201 cm$^2$) manufactured by Kitagawa Seiki Co., Ltd. The nominal pressure is a hydraulic cylinder pressure [MPa] indicated on the device.

The actual pressure [MPa]=nominal pressure [MPa]×(cylinder area/sample area)

Pressure per unit electrode area [MPa]=actual pressure [MPa]×(total electrode area/sample area)

The area of the manufactured electrodes (protruding portions of the wiring that come into contact with the anisotropic conductive film) accounted for 4.2% of the sample area.

The conductive elements were joined to one surface and the other surface of the resulting anisotropic conductive film under the conditions shown in Table 1 to prepare each of the anisotropic conductive joint packages in Examples 1 to 15 and Comparative Example 1 to 4.

Example 16

The respective treatments (A) to (G) were carried out as in Example 1 and a treatment for covering the copper protruded from the surfaces of the insulating base (anodized film) with gold was further carried out.

More specifically, the anisotropic conductive member obtained after trimming treatment in Example 1 was plated by immersion at 70° C. for 10 seconds in a gold electroless plating solution (Melplate AU-601 from Meltex Inc.).

The microstructure was observed by EF-SEM as in Example 1 and the protruded portions were found to be rounded and to have a bump height increased to about 20 nm. Observation by FE-SEM confirmed that the conductive path diameter which is the size of the electrode portion was 30 nm, the member had a thickness of 100 μm, the conductive paths did not have a branched structure, and the ratio of the number of micropores A per unit area on one surface of the oxide film to the number of micropores B per unit area on the other surface of the oxide film (A/B) was 1.0.

Then, treatment (H) of Example 1 was carried out to prepare an anisotropic conductive joint package of Example 16.

Example 17

Example 1 was repeated under the same conditions except that anodizing treatment in the anodizing treatment step (B) was carried out by using an electrolytic solution of 0.20 mol/L oxalic acid under the following conditions: voltage, 50V; solution temperature, 20° C.; solution flow velocity, 3.0 m/min, and trimming treatment (G) was carried out for 10 minutes, thereby manufacturing a structure (anisotropic conductive member).

The microstructure was observed by EF-SEM as in Example 1 and it was confirmed that the bump height was 40 nm, the conductive path diameter which is the size of the electrode portion was 130 nm and the member had a thickness of 90 μm.

Then, treatment (H) of Example 1 was carried out to prepare an anisotropic conductive joint package of Example 17.

Example 18

Example 17 was repeated under the same conditions to prepare a structure (anisotropic conductive film).

Cu penetrating electrodes having a size of 28 μm square and a pitch of 50 μm were formed in 50 μm-thick silicon wafers and four layers were formed via the structures (anisotropic conductive films).

The thermocompression bonding conditions were as follows: pressure per unit electrode area: 100 MPa; temperature: 240° C.; time: 3 minutes; and degree of vacuum: $10^{-1}$ Pa. The electric resistance in the resulting anisotropic conductive joint package was 8Ω per penetrating electrode.

Then, an underfill ThreeBond 2274B available from ThreeBond Co., Ltd. was poured and penetrated into the layer containing the anisotropic conductive film from the lateral side.

The underfill was cured under the thermal curing conditions of 85° C. and 45 minutes.

Example 19

Example 17 was repeated under the same conditions to prepare a structure (anisotropic conductive film). The respective treatments were carried out as in Example 17 and a treatment for covering the copper protruded from the surfaces of the insulating base (anodized film) with Sn—Ag was further carried out.

More specifically, the anisotropic conductive film after trimming treatment as obtained in Example 1 was treated with a Sn—Ag solder plating solution (having a tin metal ion concentration of 20 g/L, a lead metal ion concentration of 10 g/L and an alkanol sulfonic acid concentration of 150 g/L and containing a predetermined amount of brightener added thereto).

Solder plating was carried out at an agitation rate of 4 m/min and a current density of 1 A/dm$^2$ to form a film with a thickness of 2 μm. Cu penetrating electrodes having a size of 28 μm square and a pitch of 50 μm were formed in 50 μm-thick silicon wafers and four layers were formed via the structures (anisotropic conductive films).

The thermocompression bonding conditions were as follows: pressure per unit electrode area: 1 MPa; temperature: 200° C.; time: 3 minutes; and degree of vacuum: $10^{-1}$ Pa. The electric resistance in the resulting anisotropic conductive joint package was 3Ω per penetrating electrode.

An underfill ThreeBond 2274B available from ThreeBond Co., Ltd. was poured and penetrated into the layer containing the anisotropic conductive film from the lateral side.

The underfill was cured under the thermal curing conditions of 85° C. and 45 minutes.

The anisotropic conductive joint packages obtained in Examples 1 to 17 and Comparative Example 1 were evaluated for the wiring resistance. Smaller resistance values show better wiring resistance. The results are shown in Table 1.

The wiring resistance was measured as follows: an anisotropic conductive joint package in which electrical connection of one conductive portion could be confirmed after polishing of a section of an anisotropic conductive film was used to measure the DC voltage and the current to obtain thirty resistance values and determine the average of the resistance values.

TABLE 1

|  | Conductive element on one surface | Conductive element on the other surface | Nominal pressure in thermo-compression bonding (MPa) | Actual pressure in thermo-compression bonding (MPa) | Pressure per unit electrode area (MPa) | Load temperature in thermo-compression bonding (° C.) | Load time in thermo-compression bonding (s) | Resistance per penetrating electrode (Ω) |
|---|---|---|---|---|---|---|---|---|
| EX 1 | Au | Au | 0.5 | 2.1 | 50 | 240 | 60 | 0.2 |
| EX 2 | Ag | Ag | 0.5 | 2.1 | 50 | 240 | 60 | 0.1 |
| EX 3 | Cu | Cu | 0.5 | 2.1 | 50 | 240 | 60 | 0.2 |
| EX 4 | Al | Al | 0.5 | 2.1 | 50 | 240 | 60 | 0.3 |
| EX 5 | Mg | Mg | 0.5 | 2.1 | 50 | 240 | 60 | 0.5 |
| EX 6 | Ni | Ni | 0.5 | 2.1 | 50 | 240 | 60 | 0.3 |
| EX 7 | ITO | ITO | 0.5 | 2.1 | 50 | 240 | 60 | 0.2 |
| EX 8 | Au | Ag | 0.6 | 2.5 | 60 | 200 | 60 | 0.2 |
| EX 9 | Au | Cu | 0.2 | 0.8 | 19 | 500 | 120 | 0.2 |
| EX 10 | Ag | Al | 1.5 | 6.2 | 148 | 240 | 30 | 0.3 |
| EX 11 | Ag | Mg | 3 | 12.3 | 293 | 300 | 50 | 0.3 |
| EX 12 | Cu | Ni | 5 | 20.5 | 488 | 240 | 300 | 0.2 |
| EX 13 | Al | Mg | 0.5 | 2.1 | 50 | 240 | 60 | 0.1 |
| EX 14 | Mg | Ni | 0.5 | 2.1 | 50 | 240 | 60 | 0.3 |
| EX 15 | Ni | ITO | 0.5 | 2.1 | 50 | 240 | 60 | 0.2 |
| EX 16 | Au | Au | 0.5 | 2.1 | 50 | 240 | 60 | 0.2 |
| EX 17 | Au | Au | 0.5 | 2.1 | 50 | 240 | 60 | 0.2 |
| EX 18 | Au | Au | — | — | 100 | 240 | 3 min | Four-layer structure, 8 |
| EX 19 | Au | Au | — | — | 1 | 200 | 3 min | Four-layer structure, 3 |
| CE 1 | Au | Au | 0.01 | 0.04 | 1 | 200 | 60 | 3500 |
| CE 2 | Au | Au | 0.5 | 2.1 | 50 | 80 | 60 | 5500 |
| CE 3 | Au | Au | 0.5 | 2.1 | 50 | 200 | 1 | 350 |
| CE 4 | Au | Au | 0.01 | 0.04 | 1 | 80 | 1 | 6000 |

What is claimed is:

1. A method of manufacturing an anisotropic conductive joint package in which an anisotropic conductive film is joined to a conductive element of at least one material selected from the group consisting of gold (Au), silver (Ag), copper (Cu), aluminum (Al), magnesium (Mg), nickel (Ni), an indium-doped tin oxide (hereinafter abbreviated as "ITO"), molybdenum (Mo), iron (Fe), Pd (palladium), beryllium (Be) and rhenium (Re), to establish electrical connection between the anisotropic conductive film and the conductive element comprising the steps of, joining is conducted in a vacuum of at least $10^{-1}$ Pa by thermocompression bonding at the temperature of from 180° C. to 300° C., the pressure per unit electrode area of from 1 MPa to 500 MPa, and the time of from 5 seconds to 10 minutes, wherein the anisotropic conductive film has an insulating base and conductive paths composed of a conductive material, insulated from one another, and extending through the insulating base in the thickness direction of the insulating base, one end of each of the conductive paths is exposed on one side of the insulating base, and the other end of each of the conductive paths is exposed on the other side thereof, wherein the density of the conductive paths is 3,000,000 pieces/mm$^2$ or more, and the insulating base is a structure composed of an anodized film of an aluminum substrate, having micropores, and wherein the micropores do not have a branched structure in their depth direction.

2. A method of manufacturing an anisotropic conductive joint package according to claim 1, wherein the anisotropic conductive film is one in which areas where micropores are filled with the conductive material and areas where no micropores are filled with the conductive material are patterned.

3. A method of manufacturing an anisotropic conductive joint package according to claim 1, wherein the anisotropic conductive film has an insulating base thickness of from 1 to 1000 μm and a conductive path diameter of from 5 to 500 nm.

4. The method of manufacturing an anisotropic conductive joint package according to claim 1, wherein the conductive element includes: two conductive element layers provided on respective first and second sides of the anisotropic conductive film and an adhesive composition is filled between the anisotropic conductive film and the respective conductive element layers.

5. The method of manufacturing an anisotropic conductive joint package according to claim 1, wherein the package has plural sets of conductive elements, with portions of the conductive elements disposed adjacent to a respective anisotropic conductive film, each conductive element includes two conductive element layers which are provided on respective first and second sides of the anisotropic conductive film wherein at least one of the conductive element layers and the anisotropic conductive film are alternately stacked; and an adhesive composition is filled between the anisotropic conductive film and the respective conductive element layers.

6. The method of manufacturing an anisotropic conductive joint package according to claim 1, wherein the conductive element comprises two conductive element layers, one provided on respective first and second side of the anisotropic conductive film, and said package further comprising-at least interposer comprising a substrate and an electrode which is electrically connected to internal wiring of the interposer disposed within the substrate, said interposer further having external wiring disposed on one surface of the interposer.

* * * * *

UNITED STATES PATENT AND TRADEMARK OFFICE
CERTIFICATE OF CORRECTION

PATENT NO. : 8,516,690 B2  
APPLICATION NO. : 12/747128  
DATED : August 27, 2013  
INVENTOR(S) : Yusuke Hatanaka et al.

Page 1 of 1

It is certified that error appears in the above-identified patent and that said Letters Patent is hereby corrected as shown below:

On the Title page, item (30) Foreign Application Priority Data, "2008-11863" should read --2008-118639--.

Signed and Sealed this  
Eleventh Day of February, 2014

Michelle K. Lee  
*Deputy Director of the United States Patent and Trademark Office*